(12) United States Patent
Bunea (10) Patent No.: US 9,991,405 B2
(45) Date of Patent: Jun. 5, 2018

(54) SOLAR MODULE WITH ALIGNING ENCAPSULANT

(71) Applicant: SUNPOWER CORPORATION, San Jose, CA (US)

(72) Inventor: Gabriela Elena Bunea, San Jose, CA (US)

(73) Assignee: SunPower Corporation, San Jose, CA (US)

( * ) Notice: Subject to any disclaimer, the term of this patent is extended or adjusted under 35 U.S.C. 154(b) by 126 days.

(21) Appl. No.: 14/194,382

(22) Filed: Feb. 28, 2014

(65) Prior Publication Data

US 2015/0249175 A1    Sep. 3, 2015

(51) Int. Cl.
*H01L 31/048* (2014.01)
*H01L 31/18* (2006.01)

(52) U.S. Cl.
CPC ........ *H01L 31/048* (2013.01); *H01L 31/1876* (2013.01); *Y02E 10/50* (2013.01)

(58) Field of Classification Search
CPC .................................. H01L 31/048–31/049
See application file for complete search history.

(56) References Cited

U.S. PATENT DOCUMENTS

| | | | |
|---|---|---|---|
| 4,321,418 A * | 3/1982 | Dran ................. | B32B 17/10036 136/251 |
| 6,660,930 B1 | 12/2003 | Gonsiorawski | |
| 2004/0182432 A1* | 9/2004 | Yoda et al. ................... | 136/244 |
| 2010/0031997 A1* | 2/2010 | Basol ..................... | H01L 31/048 136/244 |
| 2010/0147363 A1* | 6/2010 | Huang et al. ................. | 136/251 |
| 2010/0147364 A1* | 6/2010 | Gonzalez .......... | H01L 31/02021 136/251 |
| 2011/0155210 A1* | 6/2011 | Kim ................... | H01L 31/02168 136/246 |
| 2011/0192445 A1 | 8/2011 | Solzabacher et al. | |
| 2012/0060895 A1 | 3/2012 | Rubin et al. | |
| 2012/0125438 A1* | 5/2012 | Shimizu ............. | H01L 31/0488 136/259 |
| 2012/0250995 A1 | 9/2012 | Coakely | |
| 2013/0032851 A1 | 2/2013 | Sheats | |
| 2013/0061904 A1* | 3/2013 | Tai ...................... | H01L 31/0508 136/244 |
| 2013/0206210 A1* | 8/2013 | Niinobe et al. ............... | 136/246 |
| 2013/0243939 A1* | 9/2013 | Hahn et al. ..................... | 427/74 |
| 2013/0247963 A1* | 9/2013 | Ishiguro ........................ | 136/251 |

(Continued)

FOREIGN PATENT DOCUMENTS

CN    101685838 A    3/2010
CN    102208404 A    10/2011

(Continued)

OTHER PUBLICATIONS

Definition of "emboss" [retrieved from http://www.thefreedictionary.com/emboss on Feb. 5, 2016].*

(Continued)

*Primary Examiner* — Eric R Smith
(74) *Attorney, Agent, or Firm* — Schwabe, Williamson & Wyatt, P.C.

(57) ABSTRACT

A photovoltaic module can include an encapsulant having an alignment portion configured to maintain alignment of solar cells during manufacture of the photovoltaic module.

18 Claims, 10 Drawing Sheets

(56) References Cited

U.S. PATENT DOCUMENTS

| | | | | |
|---|---|---|---|---|
| 2013/0298966 A1* | 11/2013 | Fukumochi | ......... | H01L 31/0527 |
| | | | | 136/246 |
| 2014/0000683 A1* | 1/2014 | Pretorius | ........... | H01L 31/02021 |
| | | | | 136/251 |
| 2014/0150862 A1* | 6/2014 | Liu | ....................... | H01L 31/049 |
| | | | | 136/256 |
| 2014/0261624 A1* | 9/2014 | Cruz-Campa | ........... | H01L 31/18 |
| | | | | 136/246 |

FOREIGN PATENT DOCUMENTS

| | | | | |
|---|---|---|---|---|
| EP | | 605994 A1 | * | 7/1994 |
| WO | WO 2012046319 A1 | | * | 4/2012 |
| WO | WO 2012073751 A1 | | * | 6/2012 |

OTHER PUBLICATIONS

International Search Report and Written Opinion from PCT/US2015/017854 dated May 28, 2015, 13 pgs.

International Preliminary Report on Patentability for PCT Patent Application No. PCT/US15/17854 dated Sep. 15, 2016, 9 pgs.

Second Office Action from Chinese Patent Application No. 2015800033506, dated Jan. 24, 2018, 7 pgs.

* cited by examiner

SOLAR MODULE WITH ALIGNING ENCAPSULANT

BACKGROUND

Photovoltaic (PV) cells, commonly known as solar cells, are well known devices for conversion of solar radiation into electrical energy. Generally, solar radiation impinging on the surface of, and entering into, the substrate of a solar cell creates electron and hole pairs in the bulk of the substrate. The electron and hole pairs migrate to p-doped and n-doped regions in the substrate, thereby creating a voltage differential between the doped regions. The doped regions are connected to the conductive regions on the solar cell to direct an electrical current from the cell to an external circuit. Solar cells can be combined in a solar cell string. Solar cell strings can be combined to form an array such as a PV module, the electrical energy collected from all of the solar cells can be combined in series and parallel arrangements to provide power with a certain voltage and current.

During the manufacture of PV modules, proper alignment between solar cells is required to prevent defects such as shorts between connected cells.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter of the application or uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" encapsulant does not necessarily imply that this encapsulant is the first encapsulant in a sequence; instead the term "first" is used to differentiate this encapsulant from another encapsulant (e.g., a "second" encapsulant).

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In the following description, numerous specific details are set forth, such as specific operations, in order to provide a thorough understanding of embodiments of the present disclosure. It will be apparent to one skilled in the art that embodiments of the present disclosure may be practiced without these specific details. In other instances, well-known techniques are not described in detail in order to not unnecessarily obscure embodiments of the present disclosure.

This specification first describes example PV modules that can include an encapsulant with alignment portions, followed by a more detailed description of example methods for forming PV modules that include the encapsulant having alignment portions. Various examples are provided throughout.

Figure 1:
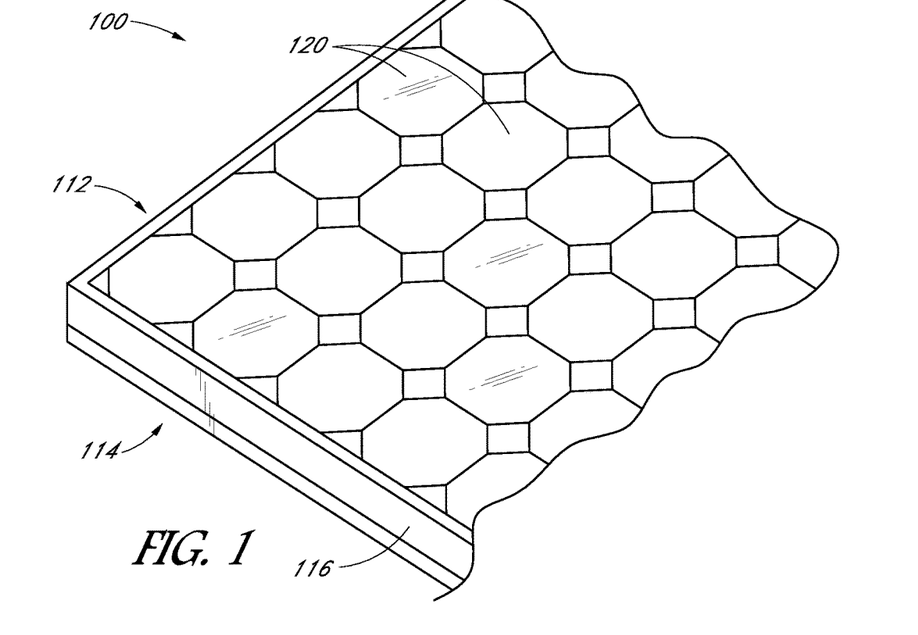
FIG. 1 illustrates a perspective view of an example PV module, according to some embodiments.

Turning now to FIG. 1, a photovoltaic (PV) module 100 having a front side 112 that faces the sun during normal operation and a back side 114 opposite the front side 112 is illustrated. In some embodiments, the PV module 100 has a frame 116 and a number of solar cells 120. Although shown as a 4 by 4 or a 16 solar cell PV module for ease of illustration, other example configurations include 36, 42, 72, 96, 128 or any number of solar cells.

Figure 2:
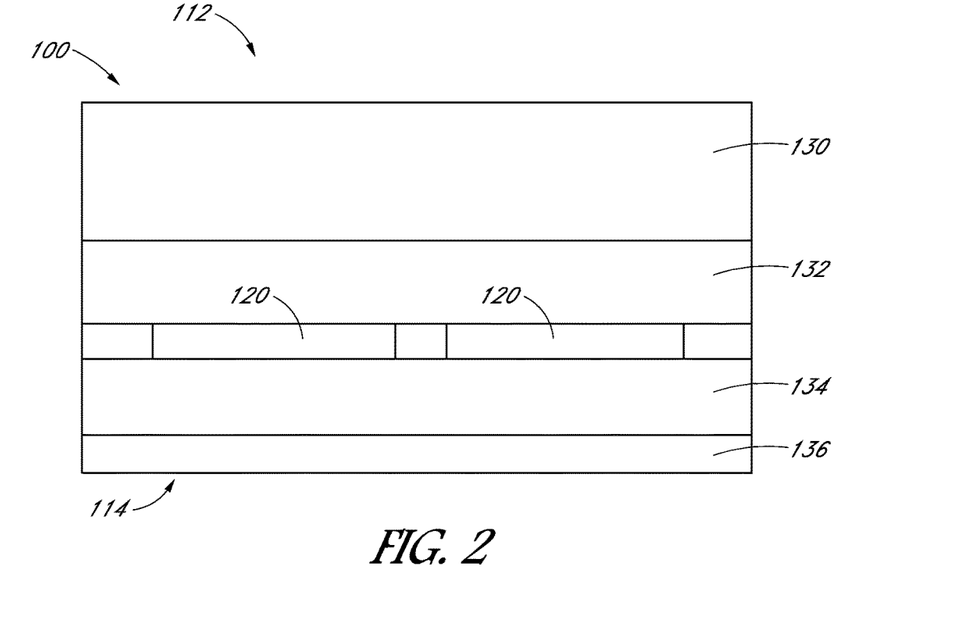
FIG. 2 illustrates a cross-sectional view of an example PV module, according to some embodiments.

FIG. 2 illustrates a cross-sectional view of the PV module 100. PV module 100 can include one or more encapsulant layers 132, 134 which surround and enclose the plurality of solar cells 120. The PV module 100 can also include a substantially transparent top cover 130 made of glass or other substantially transparent material. Substantially transparent is used herein to mean transmission of light through the layer of material can be greater than 80% for light in the ranges of 300-1200 nm. In certain embodiments, the material chosen for construction of the substantially transparent top cover 130 can be selected for properties which minimize reflection, thereby permitting the maximum amount of sunlight to reach the solar cells 120. In an embodiment, an adhesive tape or tape can be used to keep the solar cells 120 in alignment during the manufacturing of the PV module 100. The substantially transparent top cover 130 can provide structural rigidity to the PV module 100. The PV module can include a first encapsulant 132 and a second encapsulant 134 on opposite sides of solar cells 120. The PV module 100 can also have a backsheet 136. The backsheet 136 can be an electrically insulating layer which protects the underside of the PV module 100. The backsheet 136 can be a polymer sheet or composed of glass. The backsheet 100 can also be colored or transparent. In an embodiment, the backsheet 136 can be a substantially transparent backsheet. The substantially transparent top cover 130, the first encapsulant 132, solar cells 120, second encapsulant 134 and the backsheet 136 can be cured and/or laminated in a step to form a PV laminate. In an embodiment, curing can include the process by which two interfaces (e.g., encapsulants with substantially transparent top cover and/or backsheet) are optically or thermally coupled and/or the process by which two materials are bonded together.

Figure 3:
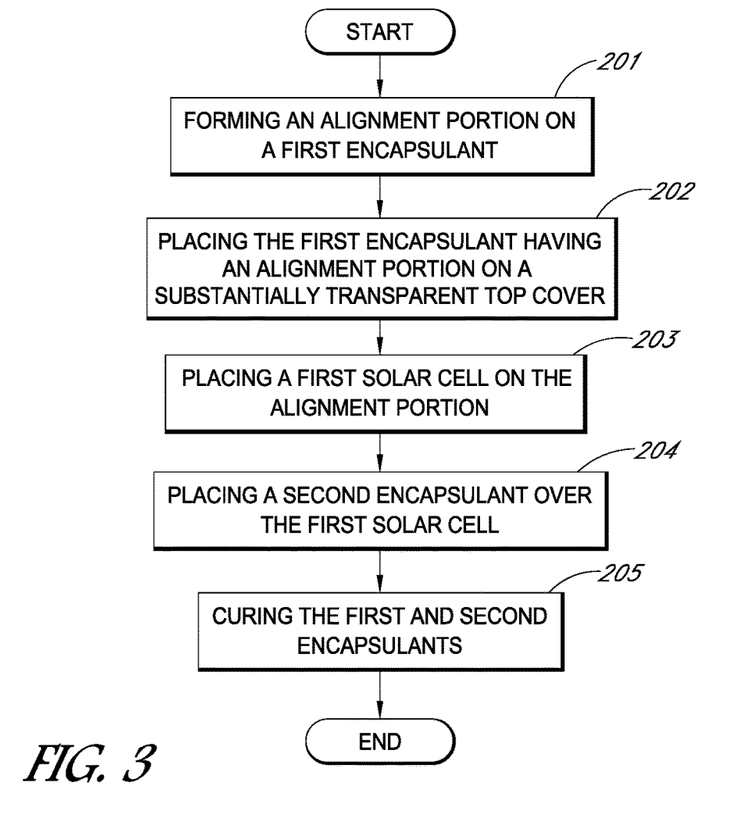
FIG. 3 illustrates a flow chart representation of an example method for manufacturing of a PV module, according to some embodiments.

With reference to FIG. 3, a flow chart illustrating a method for method for manufacturing a PV module, also referred here as a solar cell module, is shown, according to some embodiments. In various embodiments, the method of FIG. 3 can include additional (or fewer) blocks than illustrated. For example, in some embodiments, a first encapsulant can be manufactured that includes an alignment portion ready for use in a manufacturing process for a PV module.

As shown in 201, an alignment portion can be formed on a first encapsulant. Examples of alignment portions can include an embossed portion, a textured portion, a tacky portion, among other examples.

Figure 4:
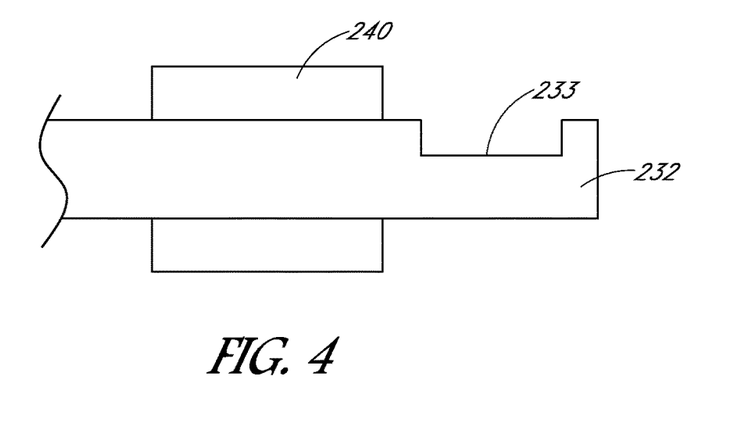
FIG. 4 illustrates forming a cross section of an alignment portion in an encapsulant, according to some embodiments.

In some embodiments forming an alignment portion can include embossinging a portion of the first encapsulant. An example of embossing a portion of the encapsulant is illustrated in FIG. 4, as described below.

In one embodiment, forming an alignment portion can include texturizing and/or tackifying a portion of the first encapsulant. In various embodiments, the encapsulant can be manufactured to include the alignment portion without an extra processing step. In other embodiments, the encapsulant can be modified after its manufacture to include the alignment portion.

In one embodiment, alignment portions can be located in portions of the encapsulant corresponding to locations of solar cells. For example, encapsulant having embossed alignment portions, the portions can be shaped and sized to allow for placement of the solar cells in the embossed portions thereby helping maintain alignment during processing. In another embodiment, the alignment portions can cover most or all of the encapsulant. For example, the encapsulant may include an embossing pattern, texture, tackiness, or other alignment feature that covers most or all of the encapsulant but that helps hold the solar cells in place during processing.

At 202, the first encapsulant having an alignment portion can be placed on a substantially transparent top cover. In an embodiment, the alignment portion can be placed in a position to receive a solar cell or a plurality of solar cells. For example, in one embodiment, the alignment portions can be configured to receive respective front sides of the solar cells.

Figure 5:
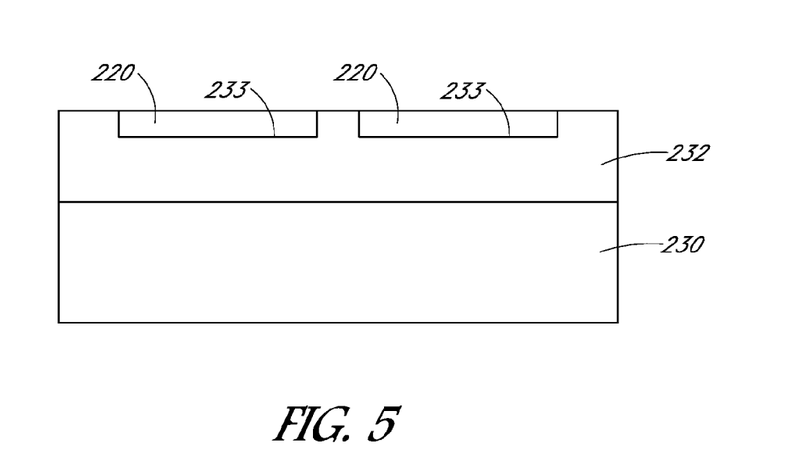
FIGS. 5 and 6 illustrate cross-sectional views of various operations of the flow chart of FIG. 3, according to some embodiments.

At 203, a first solar cell can be placed on the alignment portion of the first encapsulant. In an embodiment, a second solar cell can be placed on the alignment portion or another alignment portion (e.g., in an embodiment in which there is a one-to-one correspondence of solar cell to alignment portion). In an embodiment, a single solar cell or a plurality of solar cells can be placed on one or more alignment portions. A cross-sectional illustration of blocks 202 and 203 is illustrated in FIG. 5, as described below.

Figure 6:
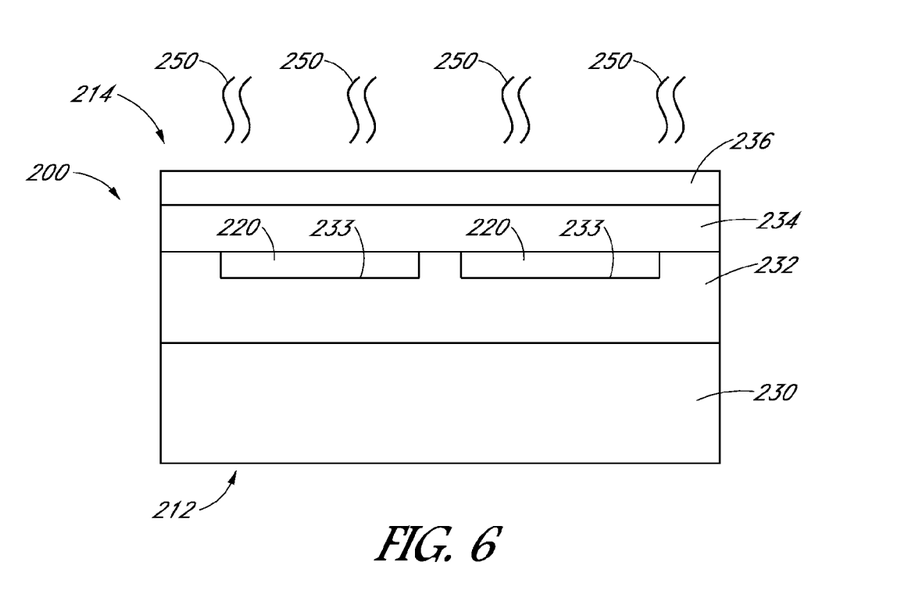

At 204, a second encapsulant can be placed over the solar cell(s). In an embodiment, the second encapsulant can have an alignment portion similar to the alignment portion of the first encapsulant. In another embodiment, the second encapsulant may not have an alignment portion. In various embodiments, a backsheet can be placed on the second encapsulant as shown in FIG. 6.

At 205, the first and second encapsulants can be cured. In an embodiment, the curing can include thermal curing or heating. In an embodiment, the curing can include curing using Ultra Violet (UV) light. In an embodiment, curing can include the process by which two interfaces (e.g., encapsulants with substantially transparent top cover and/or backsheet) are optically or thermally coupled and/or the process by which two materials are bonded together.

Figure 18:
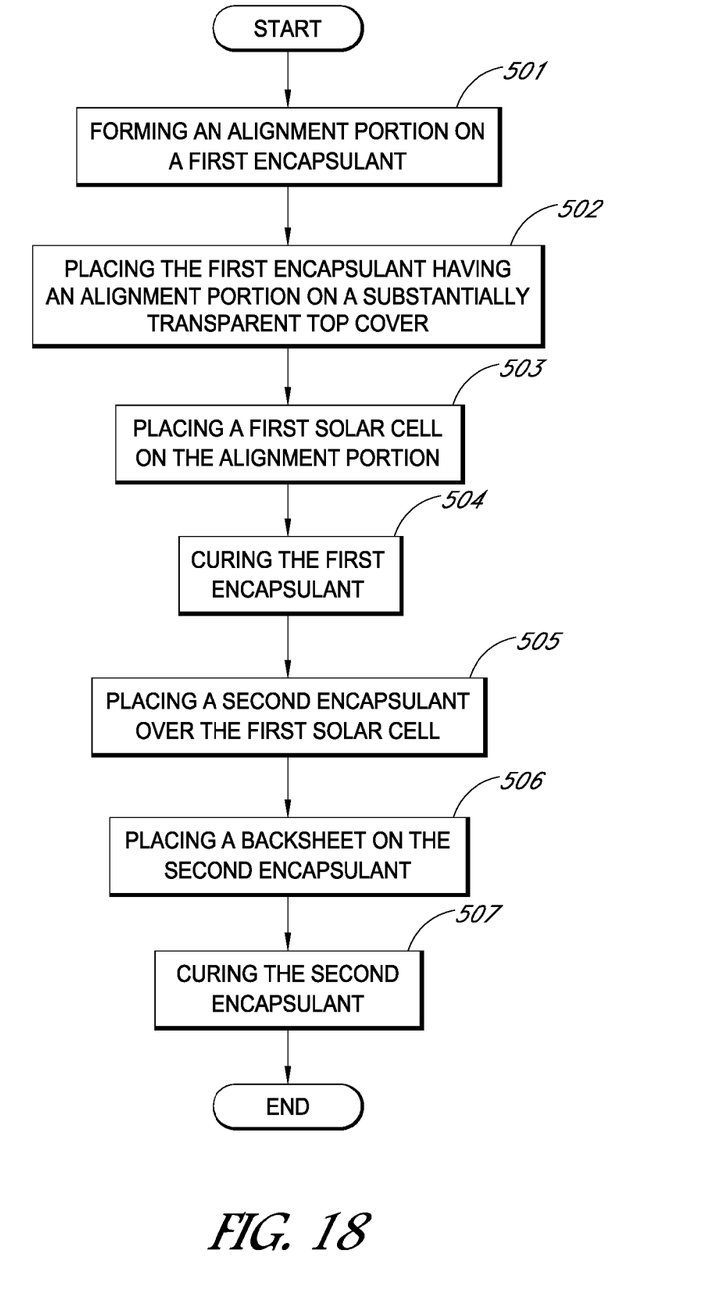
FIG. 18 illustrates a flow chart representation of still another example method for manufacturing of a PV module, according to some embodiments.

In one embodiment, the first encapsulant can be cured in a separate process from the second encapsulant. FIG. 18 shows an example method for separately curing the first and second encapsulants. In an embodiment, both the first and second encapsulant can be cured in a single process. A cross-sectional illustration of block 205 is illustrated in FIG. 6, as described below.

Turning now to FIG. 4, forming an alignment portion 233 on a first encapsulant 232 is shown. Various methods and mechanisms can be used to form the alignment portion 233 on the first encapsulant 232. In an embodiment, an embossing mechanism 240 can be used to form the alignment portion 233. In an embodiment, the alignment portion 233 can be an embossed portion 233 as shown. In another embodiment, the alignment portion can be a textured portion. Other examples of alignment portions also exist.

With reference to FIG. 5, placing a first encapsulant 232 having an alignment portion 233 on a substantially transparent top cover 230 is shown. In an embodiment, the alignment portion 233 can be formed prior to placing the first encapsulant 232. In some embodiments, an encapsulant with a preformed alignment portion 233 can be used. In some embodiments, multiple cells 220 can be placed on one or more alignment portions 233. In an embodiment, the solar cells 220 can be placed by hand or mechanically by a pick-and-place machine. In an embodiment, the friction relationship between the first encapsulant 232 and the solar cells 220 permits approximately 1 millimeter movement of the solar cells 220 on the first encapsulant 232. Many examples exist. In an example, the first encapsulant 232 can have a high friction coefficient relative to the friction coefficient of the solar cells 220 and still maintain the 1 millimeter tolerance. In another example, the first encapsulant 232 can have a low friction coefficient relative to the friction coefficient of the solar cells 220 and still maintain the 1 millimeter tolerance. In still another example, the first encapsulant 232 and the solar cells 220 can have a similar friction coefficient. By limiting the movement to such a range, the alignment portion 233 can eliminate the need for the use of tape to keep solar cells 220 in alignment during the manufacturing of a PV module. In an embodiment, the alignment portion 233 can improve the placement accuracy for the solar cells 220 to an interconnect, where the interconnect provides an electrical connection between multiple solar cells. In some embodiments, the alignment portion 233 can structurally support the solar cells 220 during PV module manufacture, reducing the risk of solar cell cracks and breakages and increasing total yield of solar cells required for manufacturing a PV module. In an embodiment, the alignment portion 233 can structurally support thin solar cells, where thin solar cells can be solar cells having a thickness which is structurally sensitive to cracks and breaking during manufacturing of PV modules. In some embodiments, the alignment portion 233 can improve the appearance of the PV module 200, where the placement accuracy for the solar cells 220 can improve the cosmetic appearance of the PV module 200. In an embodiment, the alignment portion 233 can hold the solar cells 220 in place during a metallization step in manufacturing a PV module. In some embodiments, the alignment portion 233 can structurally support the solar cells 220 during the manufacture of a bifacial PV module, where a bifacial PV module is a PV module which can generate electricity from light received from both a front and back side of the PV module. In an embodiment, a second encapsulant 234 can be placed on the solar cell(s) 220 followed by a backsheet 236 as shown in FIG. 6 and discussed below.

FIG. 6 illustrates curing 250 the first and second encapsulants 232, 234, according to some embodiments. In an embodiment, the curing 250 can include the process by which two interfaces (e.g., encapsulants with substantially transparent top cover and/or backsheet) are optically or thermally coupled and/or the process by which two materials are bonded together. In some embodiments, the curing 250 can include heating the first and second encapsulants 232, 234. In an embodiment, the curing 250 can include exposing the first and second encapsulants 232, 234 to ultraviolet (UV) light. In an embodiment, the front side 212 is face down during the PV module 200 manufacturing process to allow the placement of the first encapsulant 232 on the substantially transparent top cover 230. In some embodiments, the curing 250 can be performed with the front side 212 of the PV module 200 face down, as shown, whereas in some embodiments, curing can be performed with the front side 212 of the PV module 100 face up. In some embodiments, curing can be performed from one or both directions (e.g., from front side 212 and/or from back side 214).

In an embodiment, the alignment portion 233 can be removed as a result of curing 250. In some embodiments, at least a portion of the alignment portion 233 can remain after curing 240. In an embodiment, the curing 250 at least partially smoothes the alignment portion 233 of the first encapsulant 232. In an embodiment, the curing 250 bonds the first encapsulant 232 to the substantially transparent top cover 230. In an embodiment, the curing 250 bonds the backsheet 236 to the second encapsulant 234. In an embodiment, curing 250 can include laminating the substantially transparent top cover 230, the first encapsulant 232, solar cells 220, second encapsulant 234 and backsheet together to form a PV laminate in a step for manufacturing the PV module 200. In an embodiment, a frame can be coupled to the PV laminate in a step for manufacturing the PV module 200.

Figure 7:
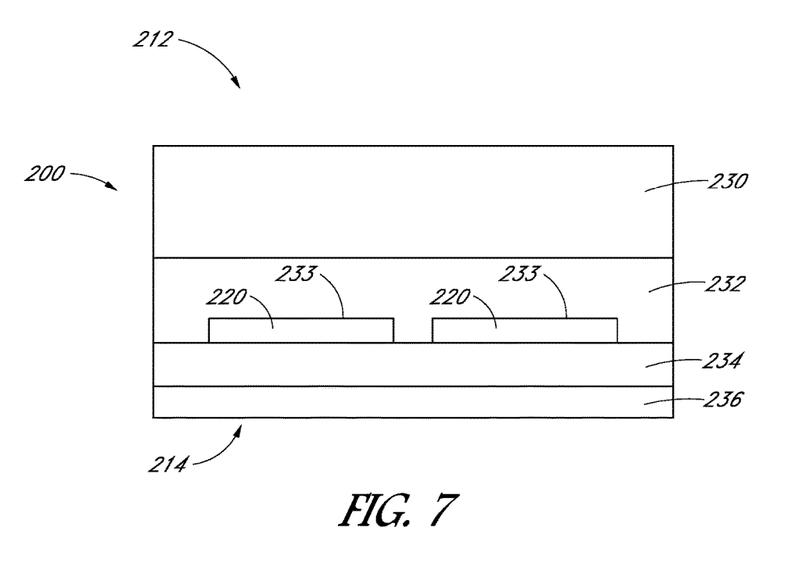
FIG. 7 illustrates a cross-sectional view of another example PV module, according to some embodiments.

Turning to FIG. 7, an example PV module 200 is shown, according to some embodiments. The PV module 200 includes a substantially transparent top cover 230. In some embodiments, the substantially transparent top cover 230 can be made of glass. The PV module 200 can also include a first encapsulant 232 having an alignment portion 233, where the alignment portion can improve alignment of the solar cells 220 during the PV module manufacturing process. In an embodiment, the alignment portion 233 can be an embossed portion, textured portion, or a combination of both the embossed and the textured portions. The PV module 200 can include a second encapsulant 234, where the first and second encapsulants 232, 334 collectively surround the solar cells 220. In an embodiment, the first and second encapsulants 232, 234 can be composed of a polyolefin, Ethyl Vinyl Acetate (EVA), Polyvinyl Butyral (PVB), Polydimethylsiloxane (PDMS), or an ionomer among other examples. The PV module can also include a backsheet 236.

Figure 8:
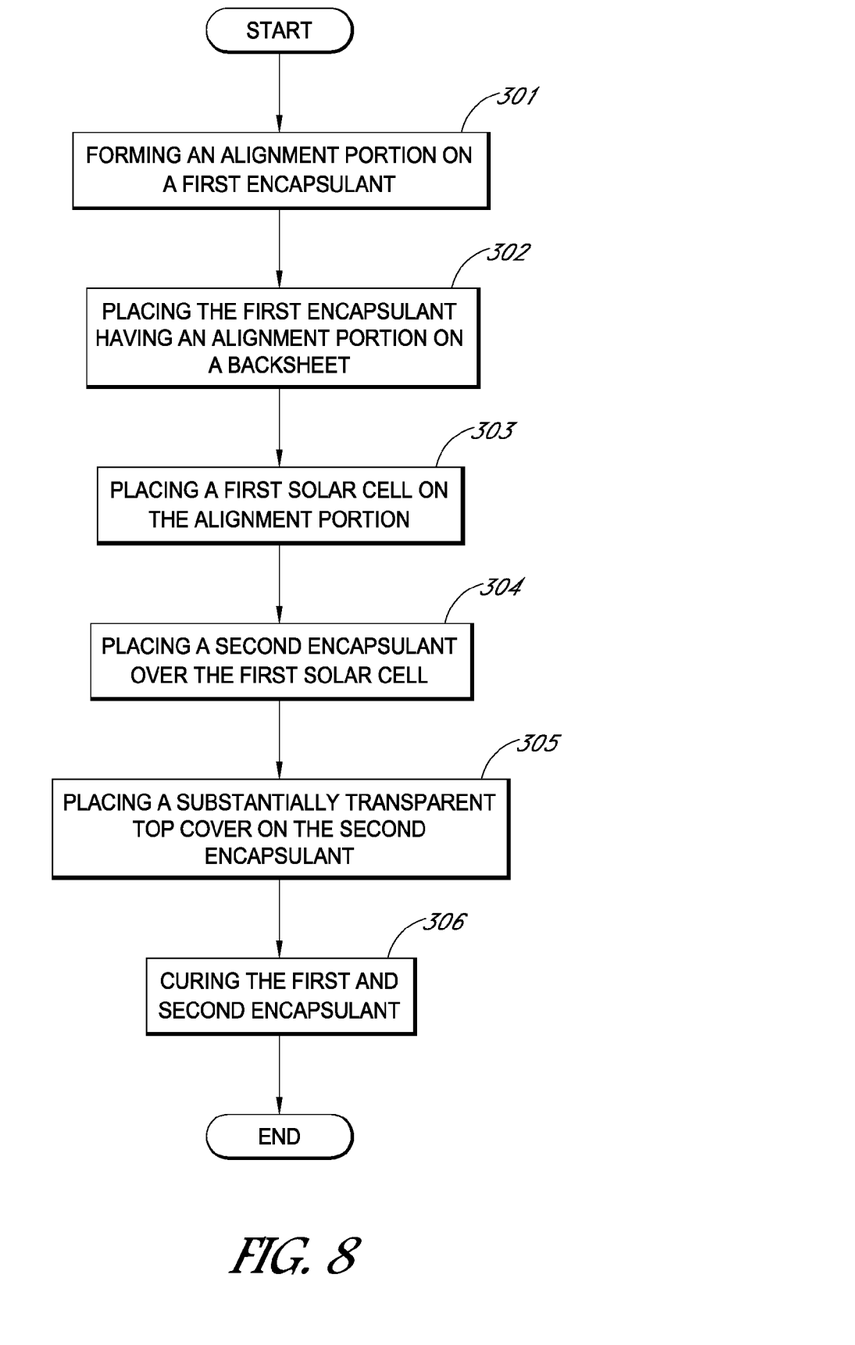
FIG. 8 illustrates a flow chart representation of another example method for manufacturing of a PV module, according to some embodiments.

With reference to FIG. 8, another flow chart illustrating an example method for method for manufacturing a solar cell module is shown, according to some embodiments. In various embodiments, the method of FIG. 8 can include additional (or fewer) blocks than illustrated. For example, an encapsulant can be manufactured such that it includes an alignment portion ready for use in a manufacturing process for a PV module.

As shown in 301, an alignment portion can be formed on a first encapsulant. Forming the alignment portion at 301 can include similar or the same process as described above at 201 and also as shown and described at FIG. 4. For example, forming an alignment portion can include embossing, texturing, among other examples, to form an alignment portion on the first encapsulant.

Figure 9:
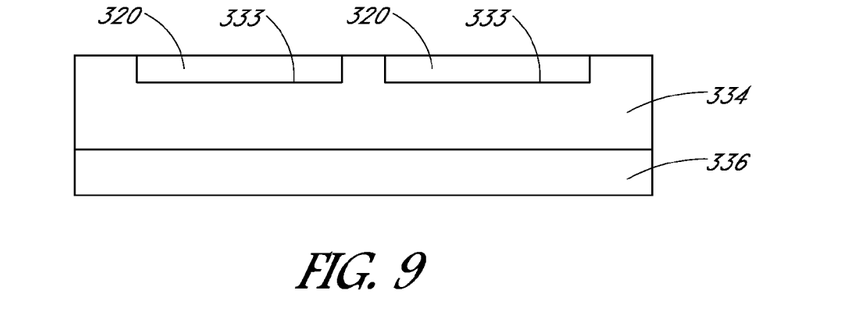
FIGS. 9 and 10 illustrate cross-sectional views of various operations of the flow chart of FIG. 8, according to some embodiments.

At 302, the first encapsulant having an alignment portion can be placed on a backsheet. In an embodiment, the alignment portion can be placed in a position to receive a solar cell or a plurality of solar cells. In one embodiment, the alignment portion can be placed in a position to receive respective back sides of the solar cells. An example of placing the first encapsulant on a backsheet is illustrated in FIG. 9, as described below.

At 303, a solar cell (e.g., a backside of the solar cell) can be placed on the alignment portion of the first encapsulant. In an embodiment, a second solar cell can be placed on the alignment portion or a different alignment portion. In an embodiment, a single solar cell or a plurality of solar cells can be placed on one or more alignment portions. A cross-sectional illustration of blocks 302 and 303 is illustrated in FIG. 9, as described below.

At 304, a second encapsulant can be placed over the first solar cell. In an embodiment, the second encapsulant can have an alignment portion similar to the alignment portion of the first encapsulant whereas in another embodiment, the second encapsulant may not have an alignment portion.

At 305, a substantially transparent top cover can be placed on the second encapsulant.

At 306, the first and second encapsulants can be cured. In an embodiment, the curing can include thermal curing or heating. In an embodiment, the curing can include curing using Ultra Violet (UV) light. In an embodiment, the first encapsulant can be cured in a separate process from the second encapsulant. In an embodiment, both the first and second encapsulant can be cured in a single process. A cross-sectional illustration of blocks 304, 305 and 306 is illustrated in FIG. 10, as described below.

Turning to FIG. 9, placing a first encapsulant 334 having an alignment portion 333 on a backsheet 336 is shown. In an embodiment, the alignment portion 333 can be formed prior to placing the first encapsulant 334. In some embodiments, an encapsulant with a preformed alignment portion 333 can be used. In some embodiments, multiple solar cells 320 can be placed on one or more alignment portions 333. In an embodiment, the solar cells 320 can be placed by hand or mechanically by a pick-and-place machine. In an embodiment, the friction relationship between the first encapsulant 334 and the solar cells 320 permits approximately 1 millimeter movement of the solar cells 320 on the first encapsulant 334. A discussed above, many examples exist. In an example, the first encapsulant 334 can have a high friction coefficient relative to the friction coefficient of the solar cells 320 and still maintain the 1 millimeter tolerance. In another example, the first encapsulant 334 can have a low friction coefficient relative to the friction coefficient of the solar cells 320 and still maintain the 1 millimeter tolerance. In still another example, the first encapsulant 334 and the solar cells 320 can have a similar friction coefficient. By limiting the movement to such a range, the alignment portion 333 can eliminate the need for the use of tape to keep solar cells in alignment during the manufacturing of a PV module. In an embodiment, the alignment portion 333 can improve the placement accuracy for the solar cells 320 to an interconnect, where the interconnect provides an electrical connection between multiple solar cells. In some embodiments, the alignment portion 333 can structurally support the solar cells during PV module manufacture, reducing the risk of solar cell cracks and breakages and increasing total yield of solar cells required for manufacturing a PV module. In an embodiment, the alignment portion 333 can structurally support thin solar cells, where thin solar cells can be solar cells having a thickness which is structurally sensitive to cracks and breaking during manufacturing of PV modules. In some embodiments, the alignment portion 333 can improve the appearance of the PV module 300, where the placement accuracy for the solar cells 320 can improve the cosmetic appearance of the PV module 300. In an embodiment, the alignment portion 333 can hold the solar cell 320 in place during a metallization step in manufacturing a PV module. In some embodiments, the alignment portion 333 can structurally support the solar cells 320 during the manufacture of a bifacial PV module, where a bifacial PV module is a PV module which can generate electricity from light received from both a front and back side of the PV module. A second encapsulant 332 can be placed on the solar cell(s) 320 followed by a substantially transparent top cover 330 as illustrated in FIG. 10 and discussed below.

Figure 10:
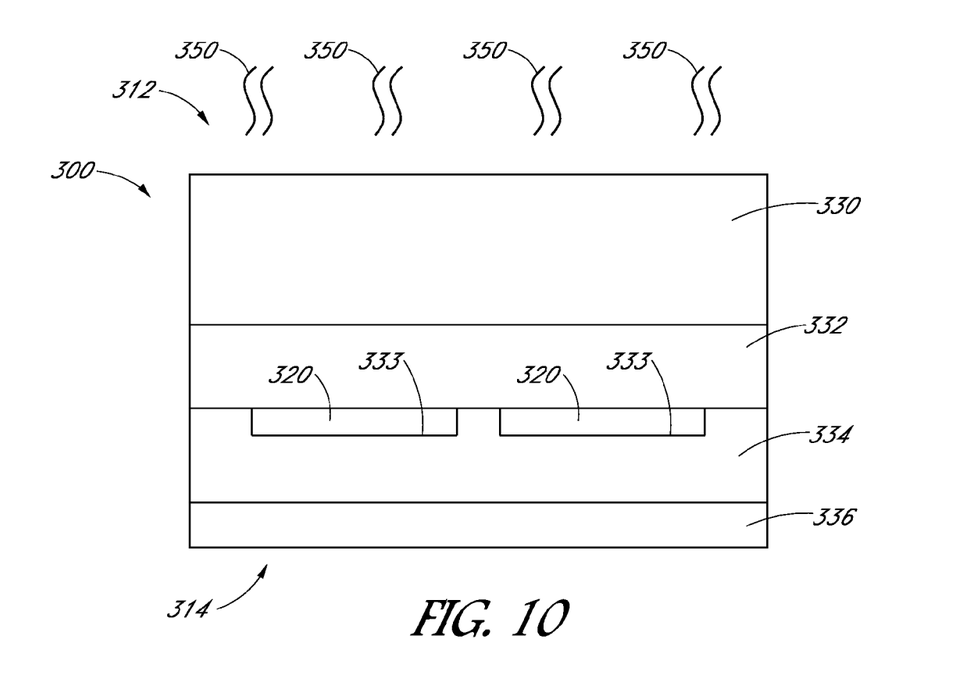

FIG. 10 illustrates curing 350 the first and second encapsulants 334, 332, according to some embodiments. Similar to FIG. 6 above, the curing 350 can include the process by which two interfaces (e.g., encapsulants with substantially transparent top cover and/or backsheet) are optically or thermally coupled and/or the process by which two materials are bonded together. In some embodiment, the curing 350 can include heating the first and second encapsulants 334, 332. In an embodiment, the curing 350 can include exposing the first and second encapsulants 334, 332 to ultraviolet (UV) light. In an embodiment, the front side 312 is face up during the PV module 200 manufacturing process to allow the placement of the first encapsulant 334 on the backsheet 336. In some embodiments, curing can be performed from one or both directions (e.g., from front side 312 and/or from back side 314).

In an embodiment, the alignment portion 333 can be removed as a result of the curing 350. In some embodiments, at least a portion of the alignment portion 333 can remain after curing 350. In an embodiment, the curing 350 at least partially smoothes the alignment portion 333 of the first encapsulant 334. In an embodiment, the curing 350 bonds the backsheet 336 to the first encapsulant 334. In an embodiment, the curing 350 bonds the second encapsulant 332 to the substantially transparent top cover 330. In an embodiment, curing 350 can include laminating the substantially transparent top cover 330, the first encapsulant 334, solar cells 320, second encapsulant 332 and backsheet 336 together to form a PV laminate in a step for manufacturing the PV module 300. In an embodiment, a frame can be coupled to the PV laminate in a step to form the PV module 300.

Figure 11:
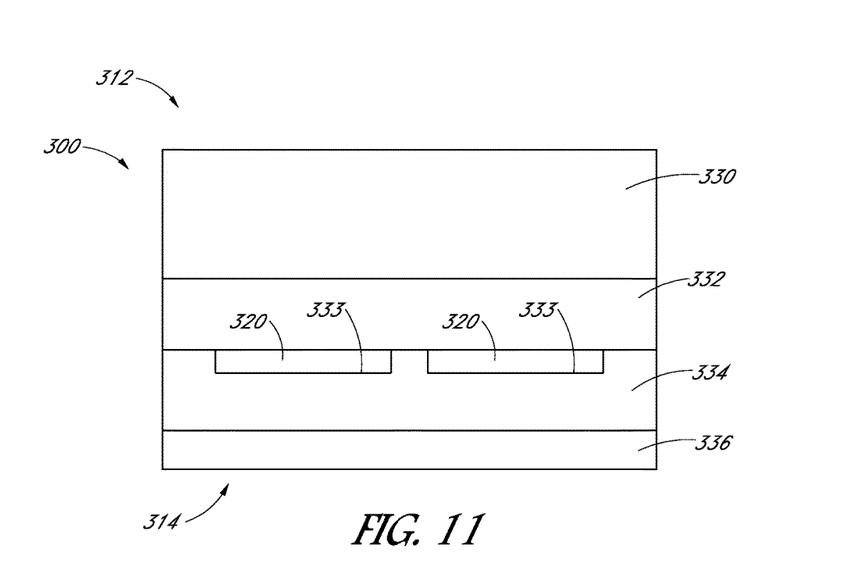
FIGS. 11-14 illustrate cross-sectional views of various example PV modules, according to some embodiments.

Turning to FIG. 11, an example PV module 300 that results from the disclosed processing steps is shown, according to some embodiments. The PV module 300 includes a substantially transparent top cover 330. In some embodiments the substantially transparent top cover 330 can be made of glass. The PV module 300 can also include a first encapsulant 334 having an alignment portion 333, where the alignment portion maintains the alignment of the solar cells 320 during the PV module manufacturing process. In an embodiment, the alignment portion 333 can be an embossed portion, textured portion, tacky portion, among others, or even a combination of embossed, textured, tacky, or other alignment portion. The PV module 300 can include a second encapsulant 332, where the solar cells 320 are located between the first and second encapsulants 334, 332. In an embodiment, the first and second encapsulants 334, 332 can be composed of a polyolefin, Ethyl Vinyl Acetate (EVA), Polyvinyl Butyral (PVB), Polydimethylsiloxane (PDMS), or an ionomer among other examples. The PV module can also include a backsheet 336.

Figure 12:
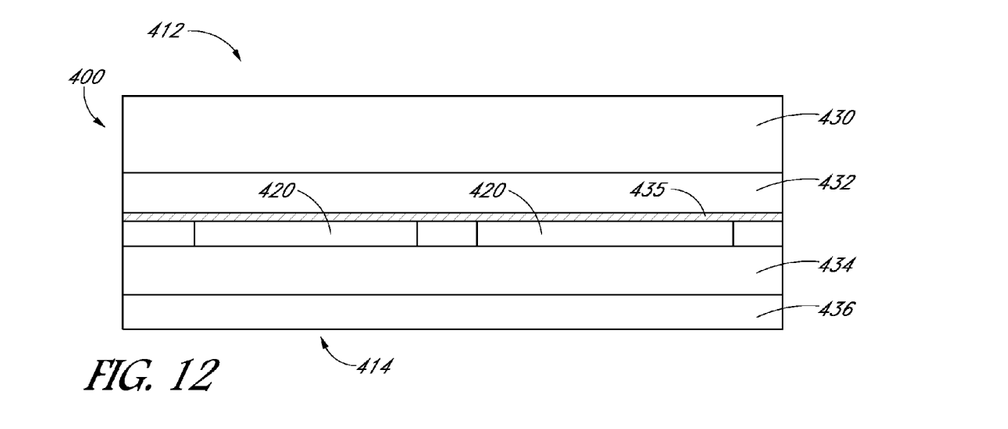
Figure 13:
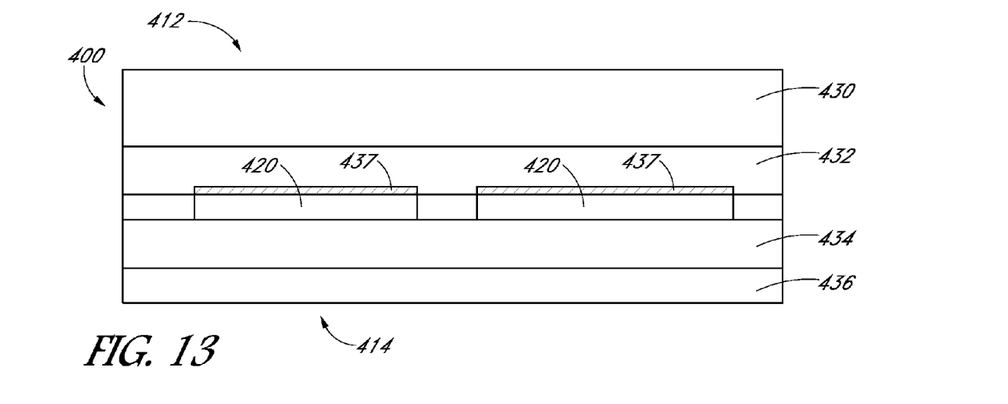
Figure 14:
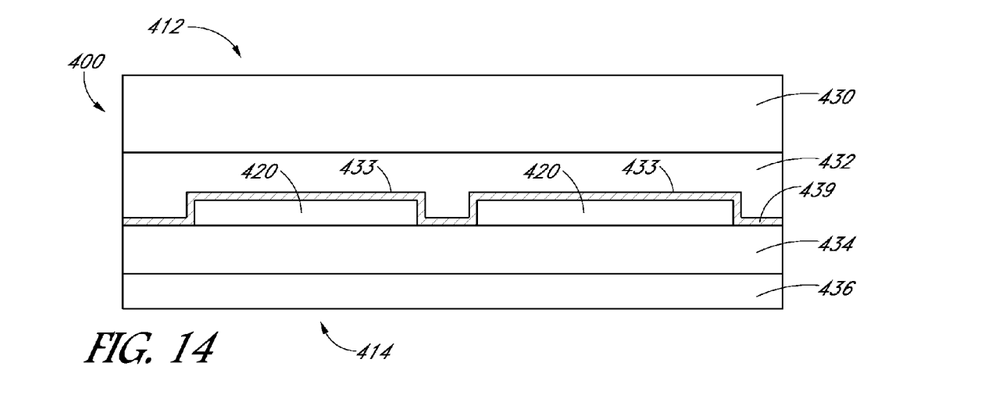

FIGS. 12-14 illustrate various examples of PV modules 400 with different encapsulant configurations. Each of the PV modules 400 includes a substantially transparent top cover 430. In some embodiments the substantially transparent top cover 430 can be made of glass. The PV module 400 can also include a first encapsulant 432. FIGS. 12-14 illustrate different encapsulant configurations. The PV module 400 can include a second encapsulant 434 and a backsheet 436.

FIG. 12 illustrates a PV module 400 with a first encapsulant 432 having a textured portion 435 covering a surface of the first encapsulant 432. In some embodiments, the textured portion 435 can instead be an adhesive/tacky or other portion.

With reference to FIG. 13, there is shown a PV module 400 with a first encapsulant 432 having a textured portion 437 in specific locations corresponding to locations of solar cells 420 to allow for proper (e.g., within an acceptable alignment tolerance) alignment of the solar cells 420. In some embodiments, the textured portion 437 can instead be an adhesive/tacky or other portion.

FIG. 14 illustrates a PV module 400 with a first encapsulant 432 having a textured portion 439 and embossed portions 433. In some embodiments, the textured portion 439 can instead be an adhesive/tacky or other portion.

Note that the solar modules illustrated in FIGS. 12-14 are illustrates. In other embodiments, both a first and second encapsulant 432, 434 (e.g., similar to the encapsulants illustrated in FIGS. 2, 7 and 11-14) can include alignment portions (whether the same type and configuration or different).

Figure 15:
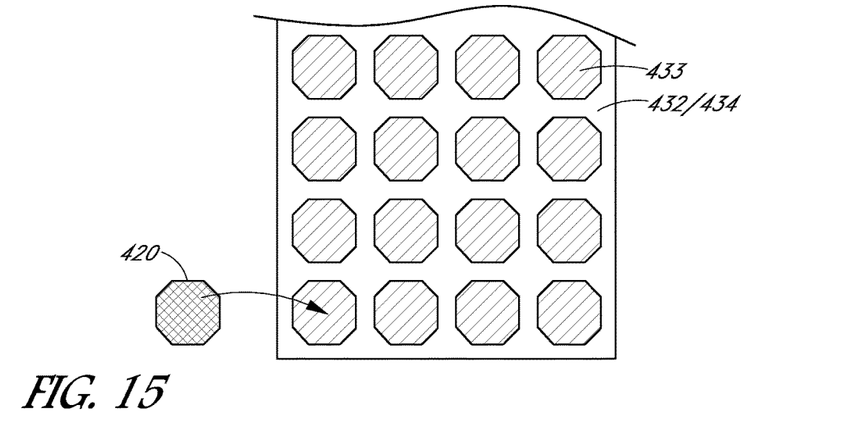
FIGS. 15 and 16 illustrate top-down views of example encapsulants, according to some embodiments.
Figure 16:
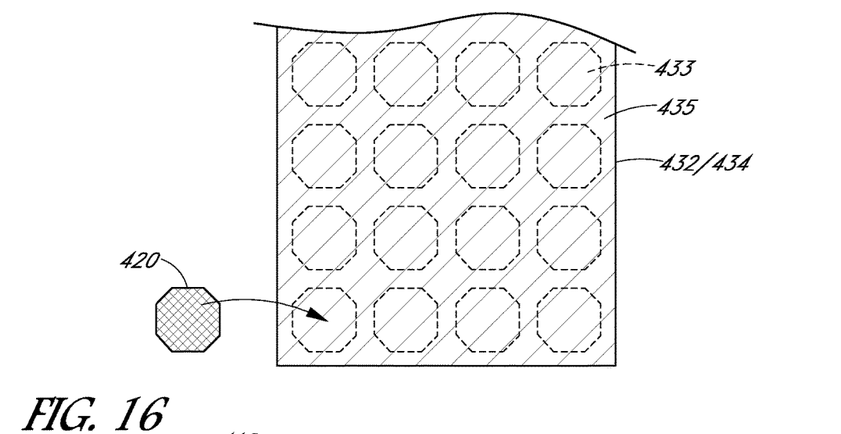

FIGS. 15 and 16 illustrate top-down views of respective example encapsulants. FIG. 15 shows a top-down view of the first encapsulant of FIG. 13 and FIG. 16 shows a top-down view of the first encapsulant of FIG. 12. FIGS. 15 and 16 both show that any of the first and second encapsulants 432, 434 can have an alignment portion 433, where the alignment portion can include an embossed portion, a textured portion, a tacky/adhesive portion, a combination of embossed, textured, and/or tacky, among other examples. Also, in addition to the first encapsulant having an alignment portion, the second encapsulants can likewise have an alignment portion to help maintain alignment of solar cells 420. In an embodiment, the alignment portions 433 can have the same shape as the solar cell 420, as shown. In some embodiments not illustrated, the alignment portion 433 can be circular, square, semi-square, rectangular, polygonal (e.g., hexagonal, octagonal, etc.), elliptical or any other shape.

Figure 17:
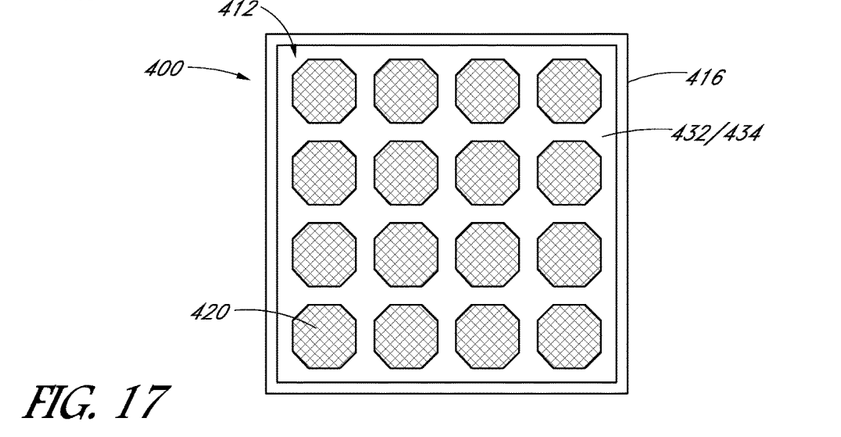
FIG. 17 illustrates a top-down view of an example PV module, according to some embodiments.

Turning now to FIG. 17, a photovoltaic (PV) module 400 having a front side 412 that faces the sun during normal operation and a back side opposite the front side 412 is shown. In some embodiments, the PV module 400 has a frame 416 and solar cells 420. Even though the illustrated PV module is a 4 by 4 or a 16 solar cell PV module, other configurations can exist, such as a 36, 42, 72, 96, 128 cell module.

With reference to FIG. 18, a flow chart illustrating still another method for manufacturing a PV module is shown, according to some embodiments. In various embodiments, the method of FIG. 18 can include additional (or fewer) blocks than illustrated. For example, in some embodiments, a first encapsulant can be manufactured that includes an alignment portion ready for use in a manufacturing process for a PV module.

As shown in 501, an alignment portion can be formed on a first encapsulant. Examples of alignment portions can include an embossed portion, a textured portion, a tacky portion, among other examples.

In some embodiments forming an alignment portion can include embossinging a portion of the first encapsulant. An example of embossing a portion of the encapsulant is illustrated in FIG. 4, as described above.

In one embodiment, alignment portions can be located in portions of the encapsulant corresponding to locations of solar cells. For example, for an encapsulant having embossed alignment portions, the portions can be shaped and sized to allow for placement of the solar cells in the embossed portions thereby helping maintain alignment during processing. In another embodiment, the alignment portions can cover most or all of the encapsulant.

At 502, the first encapsulant having an alignment portion can be placed on a substantially transparent top cover. In an embodiment, the alignment portion can be placed in a position to receive a plurality of solar cells. For example, in one embodiment, the alignment portions can be configured to receive respective front sides of the solar cells.

At 503, a first solar cell can be placed on the alignment portion of the first encapsulant. In an embodiment, a second solar cell can be placed on the alignment portion or another alignment portion (e.g., in an embodiment in which there is a one-to-one correspondence of solar cell to alignment portion). In an embodiment, a single solar cell or a plurality of solar cells can be placed on one or more alignment portions.

At 504, the first encapsulant can be cured. In an embodiment, the curing can include thermal curing or heating. In an embodiment, the curing can include curing using Ultra Violet (UV) light.

At 505, a second encapsulant can be placed over the solar cell(s). In an embodiment, the second encapsulant can have an alignment portion similar to the alignment portion of the first encapsulant. In another embodiment, the second encapsulant may not have an alignment portion.

At 506, a backsheet can be placed on the second encapsulant.

At 507, the second encapsulant can be cured. In an embodiment, the curing can include thermal curing or heating. In an embodiment, the curing can include curing using Ultra Violet (UV) light.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method for manufacturing a solar cell module, the method comprising:

placing a first surface of a first encapsulant having an alignment portion on a substantially transparent top cover, wherein the alignment portion of the first encapsulant comprises a plurality of recesses formed in a second surface of the first encapsulant, the second surface opposite the first surface, wherein each of the plurality of recesses has a polygon geometry having at least six sides, wherein the second surface of the encapsulant is textured only in the plurality of recess;

placing a plurality of solar cells in corresponding ones of the plurality of recesses of the alignment portion of the first encapsulant, wherein the plurality of solar cells remains exposed after placing the plurality of solar cells in the corresponding ones of the plurality of recesses of the alignment portion of the first encapsulant;

subsequent to placing the plurality of solar cells in corresponding ones of the plurality of recesses of the alignment portion of the first encapsulant, metallizing the plurality of solar cells on a side of the plurality of solar cells opposite the recesses, wherein the plurality of recesses of the alignment portion of the first encapsulant hold the plurality of solar cells in place during the metallizing the plurality of solar cells;

subsequent to metallizing the plurality of solar cells on the side of the plurality of solar cells opposite the recesses, placing a second encapsulant over the plurality of solar cells and on the second surface of the first encapsulant; and bonding the first and second encapsulants to the plurality of solar cells.

2. The method of claim 1, wherein bonding the first and second encapsulants comprises exposing the first and second encapsulants to ultraviolet (UV) light.

3. The method of claim 1, wherein bonding the first and second encapsulants comprises heating the first and second encapsulants.

4. The method of claim 1, further comprising placing a backsheet on the second encapsulant prior to bonding.

5. The method of claim 4, wherein the bonding also bonds the backsheet to the second encapsulant.

6. The method of claim 5, further comprising:
coupling a photovoltaic laminate on a frame, the photovoltaic laminate comprising the plurality of solar cells, the first and second encapsulants, the substantially transparent top cover, and the backsheet.

7. The method of claim 1, further comprising forming the plurality of recesses in the second surface of the first encapsulant by embossing the first encapsulant.

8. The method of claim 1, wherein bonding at least partially smooths the alignment portion of the first encapsulant.

9. The method of claim 1, further comprising forming the alignment portion.

10. A method for manufacturing a solar cell module, the method comprising:
placing a first surface of a first encapsulant having an alignment portion on a substantially transparent top cover, wherein the alignment portion of the first encapsulant comprises a plurality of recesses formed in a second surface of the first encapsulant, the second surface opposite the first surface, wherein the second surface of the encapsulant is textured only in the plurality of recess;

placing a plurality of solar cells in corresponding ones of the plurality of recesses of the alignment portion of the first encapsulant, wherein the plurality of solar cells remains exposed after placing the plurality of solar cells in the corresponding ones of the plurality of recesses of the alignment portion of the first encapsulant;

subsequent to placing the plurality of solar cells in corresponding ones of the plurality of recesses of the alignment portion of the first encapsulant, metallizing the plurality of solar cells on a side of the plurality of solar cells opposite the recesses, wherein the plurality of recesses of the alignment portion of the first encapsulant hold the plurality of solar cells in place during the metallizing the plurality of solar cells;

subsequent to metallizing the plurality of solar cells on the side of the plurality of solar cells opposite the recesses, placing a second encapsulant over the plurality of solar cells and on the second surface of the first encapsulant; and bonding the first and second encapsulants to the plurality of solar cells.

11. The method of claim 10, wherein bonding the first and second encapsulants comprises exposing the first and second encapsulants to ultraviolet (UV) light.

12. The method of claim 10, wherein bonding the first and second encapsulants comprises heating the first and second encapsulants.

13. The method of claim 10, further comprising placing a backsheet on the second encapsulant prior to bonding.

14. The method of claim 13, wherein the bonding also bonds the backsheet to the second encapsulant.

15. The method of claim 14, further comprising:
coupling a photovoltaic laminate on a frame, the photovoltaic laminate comprising the plurality of solar cells, the first and second encapsulants, the substantially transparent top cover, and the backsheet.

16. The method of claim 10, further comprising forming the plurality of recesses in the second surface of the first encapsulant by embossing the first encapsulant.

17. The method of claim 10, wherein bonding at least partially smooths the alignment portion of the first encapsulant.

18. The method of claim 10, further comprising forming the alignment portion.

* * * * *